(12) United States Patent
Liang et al.

(10) Patent No.: US 8,952,465 B2
(45) Date of Patent: Feb. 10, 2015

(54) MEMS DEVICES, PACKAGED MEMS DEVICES, AND METHODS OF MANUFACTURE THEREOF

(75) Inventors: Kai-Chih Liang, Zhubei (TW); Chun-Wen Cheng, Zhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/549,095

(22) Filed: Jul. 13, 2012

(65) Prior Publication Data

US 2014/0015069 A1 Jan. 16, 2014

(51) Int. Cl.
*H01L 29/84* (2006.01)

(52) U.S. Cl.
USPC .......................................... 257/415

(58) Field of Classification Search
USPC .......................................... 257/415
See application file for complete search history.

(56) References Cited

U.S. PATENT DOCUMENTS

| | | | |
|---|---|---|---|
| 2012/0175715 A1* | 7/2012 | Hammond et al. | 257/415 |
| 2012/0238042 A1* | 9/2012 | Ossimitz | 438/14 |
| 2012/0326248 A1* | 12/2012 | Daneman et al. | 257/415 |

* cited by examiner

*Primary Examiner* — David Vu
*Assistant Examiner* — Brandon Fox
(74) *Attorney, Agent, or Firm* — Slater & Matsil, L.L.P.

(57) ABSTRACT

MEMS devices, packaged MEMS devices, and methods of manufacture thereof are disclosed. In one embodiment, a microelectromechanical system (MEMS) device includes a first MEMS functional structure and a second MEMS functional structure. An interior region of the second MEMS functional structure has a pressure that is different than a pressure of an interior region of the first MEMS functional structure.

18 Claims, 10 Drawing Sheets

MEMS DEVICES, PACKAGED MEMS DEVICES, AND METHODS OF MANUFACTURE THEREOF

BACKGROUND

Microelectromechanical system (MEMS) devices comprise a relatively new technology that combines semiconductors with very small mechanical devices. MEMS devices are micro-machined sensors, actuators, and other structures that are formed by the addition, subtraction, modification, and patterning of materials using techniques originally developed for the semiconductor device/integrated circuit industry. MEMS devices are used in a variety of applications, such as in sensors for motion controllers, inkjet printers, airbags, microphones, and gyroscopes, as examples. The applications that MEMS devices are used in continue to expand and now also include applications such as mobile phones, automobiles, global positioning systems (GPS), video games, consumer electronics, automotive safety, and medical technology, as examples.

One type of smaller packaging for MEMS devices that has been developed is wafer level packaging (WLP). WLP involves packaging MEMS devices in packages that typically include a redistribution layer (RDL) that is used to fan out wiring for contact pads of the MEMS devices, so that electrical contact can be made on a larger pitch than contact pads of the MEMS devices and connections can be made to other devices or to a board in an end application, for example.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of the embodiments of the present disclosure are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure.

Embodiments of the present disclosure are related to the manufacturing and packaging of MEMS devices. Novel MEMS devices, manufacturing methods, and packaged MEMS devices will be described herein.

Figure 1:
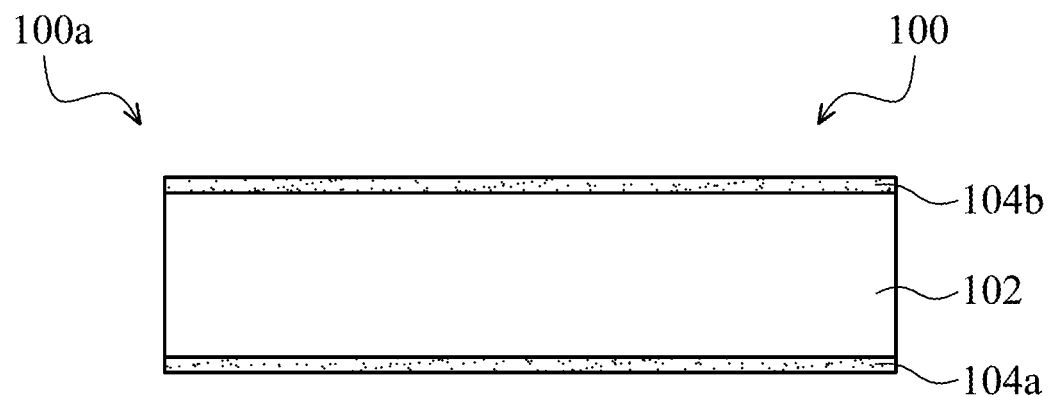
FIGS. 1 through 12 are cross-sectional views illustrating a method of manufacturing and packaging a MEMS device in accordance with an embodiment.

FIGS. 1 through 12 are cross-sectional views illustrating a method of manufacturing and packaging a MEMS device 100 in accordance with an embodiment. Referring first to FIG. 1, there is shown a cross-sectional view of a MEMS functional structure 100a of a MEMS device 100 at an initial stage of manufacturing in accordance with an embodiment of the present disclosure. The MEMS functional structure 100a includes a substrate 102. The substrate 102 may comprise silicon wafer, GaAs wafer, glass, or other materials. The substrate 102 is also referred to herein as a first substrate. An oxide 104a and 104b is formed on the front and back side of the substrate 102 using an oxidation process. The oxide 104a and 104b comprises silicon dioxide having a thickness of about 2 µm, or greater than 2 µm to reduce parasitic feedthrough capacitance while operating MEMS devices, as examples, although alternatively, the oxide 104a and 104b may comprise other materials and dimensions.

Figure 2:
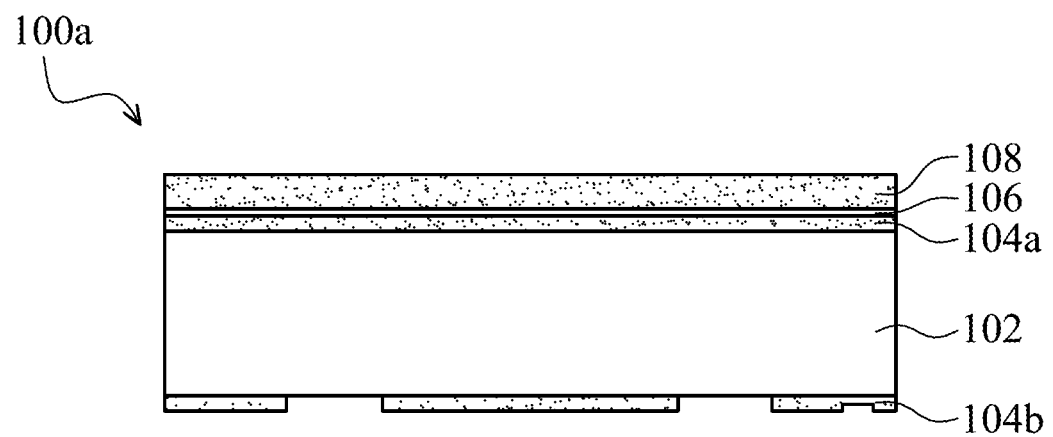
Figure 3:
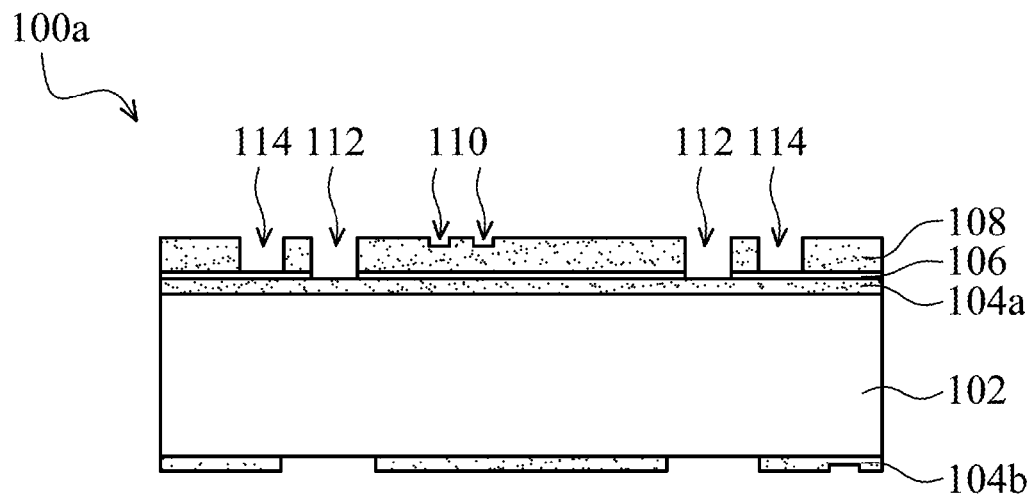

The oxide 104b on the back side of the substrate 102 is patterned using a lithography process, as shown in FIG. 2. The oxide 104b can be patterned by depositing a layer of photoresist (not shown) over the oxide 104b, exposing the layer of photoresist to energy reflected from or transmitted through a lithography mask (also not shown), developing the layer of photoresist, and then removing the exposed or unexposed photoresist, depending on whether the photoresist is positive or negative, for example. Portions of the layer of photoresist are then ashed or etched away, and the layer of photoresist is then used as an etch mask while portions of the oxide 104b are etched away using an etch process. The patterns in the oxide 104b comprise alignment marks or reference feature patterns, e.g., dicing cut lines for subsequent integration processes usage, that are used to align the substrate 102 during subsequent various manufacturing processes, for example.

After the patterning of the oxide 104b, the substrate 102 is inverted, as shown in FIG. 2. A stopper layer 106 comprising a nitride having a thickness of about hundreds of nanometers, e.g., about 200 nm, is formed on the front side of the substrate 102, and a dielectric film 108 comprising an oxide such as silicon dioxide having a thickness of about 2 µm, or greater than 2 µm, is formed over the stopper layer 106, also shown in FIG. 2. The stopper layer 106 may comprise SiN and can be used for a subsequent oxide release step, for example. Alternatively, the stopper layer 106 and the dielectric film 108 may comprise other materials and dimensions.

Shallow leakage trenches 112 and patterns for anchors or trenches 114 and bumps 110 are formed on the front side of the substrate 102. The bump patterns 110 are formed in a top surface of the dielectric film 108, and the shallow leakage trenches 112, providing a path for vacuum pressure leak after WLP processes, are formed through the dielectric film 108. The anchor patterns 114 are formed only in the dielectric film 108. The shallow leakage trenches 112 and patterns for anchors 114 and bumps 110 are formed either using three lithography processes, e.g., using three lithography masks and three etch processes, in some embodiments. Alternatively, the shallow leakage trenches 112 and patterns for anchors 114 and bumps 110 are formed in one lithography process, and the final etch depth control in each specified locations 110, 112, and 114 are determined by pattern size features, e.g., by a dry plasma etching loading effect wherein the larger the opening size, the deeper the etched depth is. Alternatively, the shallow trenches 112 and the patterns for the anchors 114 and bumps 110 can be directly patterned.

Figure 4:
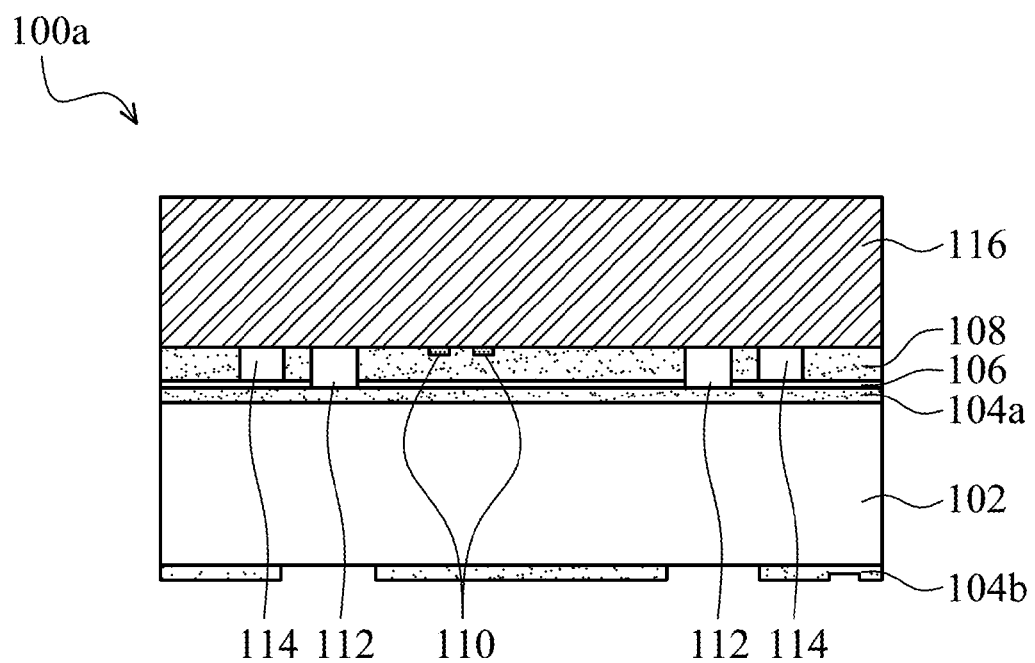
Figure 5:
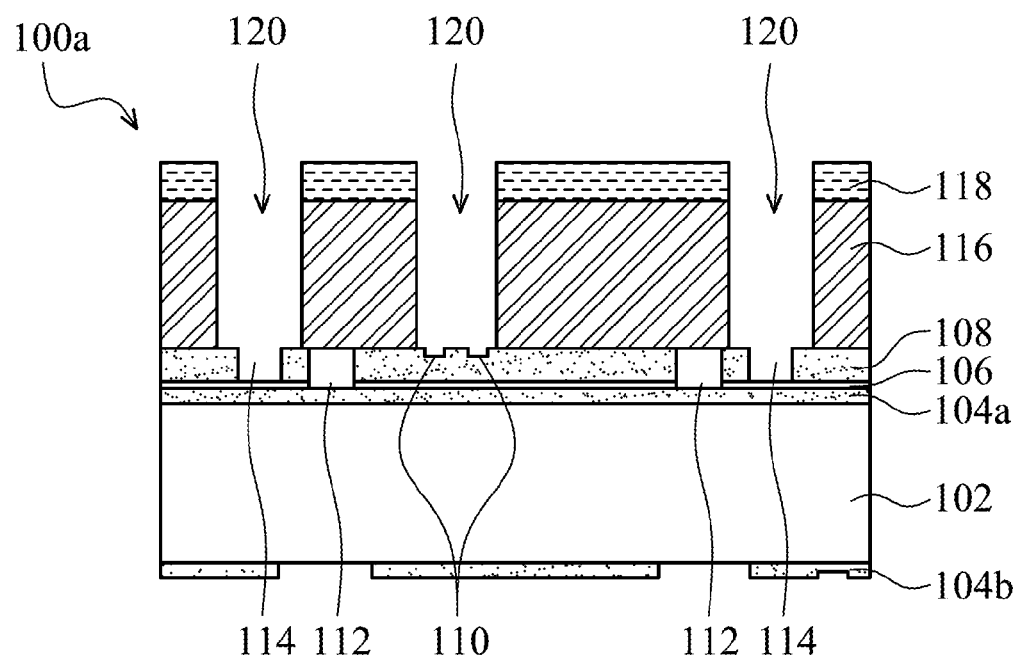

Referring next to FIG. 4, a second substrate 116 is provided. The second substrate 116 comprises similar materials described for the first substrate 102 and in some embodiments comprises silicon. The second substrate 116 is bonded using a wafer bonding process to the front side of the first substrate 102. The second substrate 116 can be bonded to the first substrate 102 using fusion bonding, as an example. The second substrate 116 is thinned using a grinding process, CMP process, dry plasma etch back process, or combinations of such processes to control a final second substrate 116 thickness to about 10 μm to about 60 μm as an example. An oxide 118 comprising silicon dioxide having a thickness of about 2 μm is deposited on the substrate 116. The oxide 118 may alternatively comprise other materials and dimensions. The oxide 118 is used later for gap control of the MEMS device 100 and the thickness is selected as needed for the MEMS functional structure 100a. The oxide 118 and second substrate 116 are patterned, e.g., using a dry plasma reactive ion etch (RIE) and a deep reactive ion etch (DRIE) process, as shown in FIG. 5, forming patterns 120 for plugs.

Figure 6:
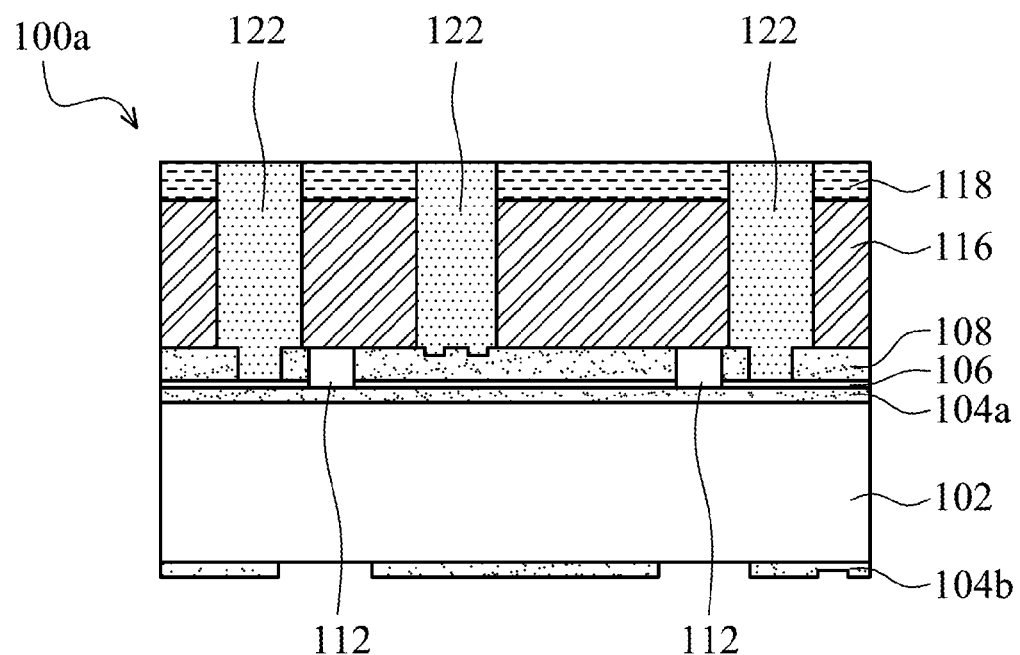

Polysilicon or other type of semiconductive material is formed over the oxide 118, filling the patterns 120 in the oxide 118 and second substrate 116. The polysilicon is planarized using a chemical mechanical polishing (CMP) process and/or an etch process, removing the polysilicon from over the top surface of the oxide 118 and leaving polysilcon plugs 122 formed in the dielectric film 108, substrate 116, and oxide 119, as shown in FIG. 6. The polysilicon plugs 122 at the edges in FIG. 6 comprise anchors for the MEMS functional structure 100a, and the polysilicon plug 122 in the center comprises a stop for a movable element of the MEMS functional structure 100a, for example, in some embodiments.

Figure 7:
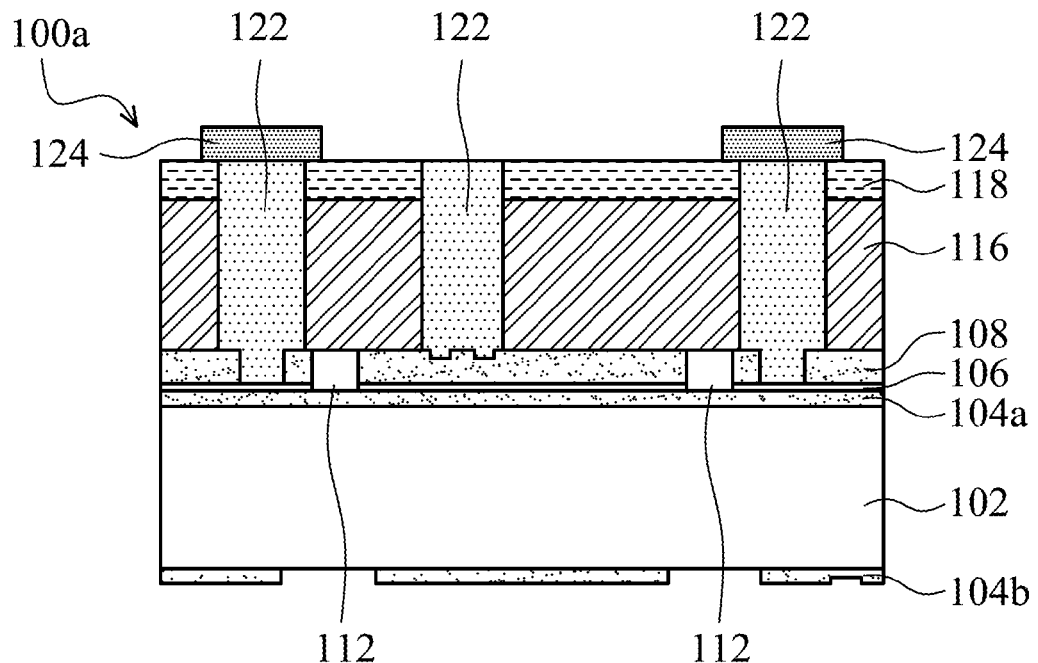

A conductive material 124 is formed over the oxide 118 and the top surface of the polysilicon plugs 122. The conductive material 124 may comprise a metal, Ge, and/or a metal alloy that is formed by sputtering in some embodiments. The conductive material 124 may have a thickness of about 0.5 μm or greater, for example. Alternatively, the conductive material 124 may comprise other materials and dimensions, and may be formed by other methods. The conductive material 124 is patterned using a lithography process, leaving conductive material 124 disposed over the anchors comprising the plugs 122 at the edges of the MEMS functional structure 100a, as shown in FIG. 7.

Figure 8:
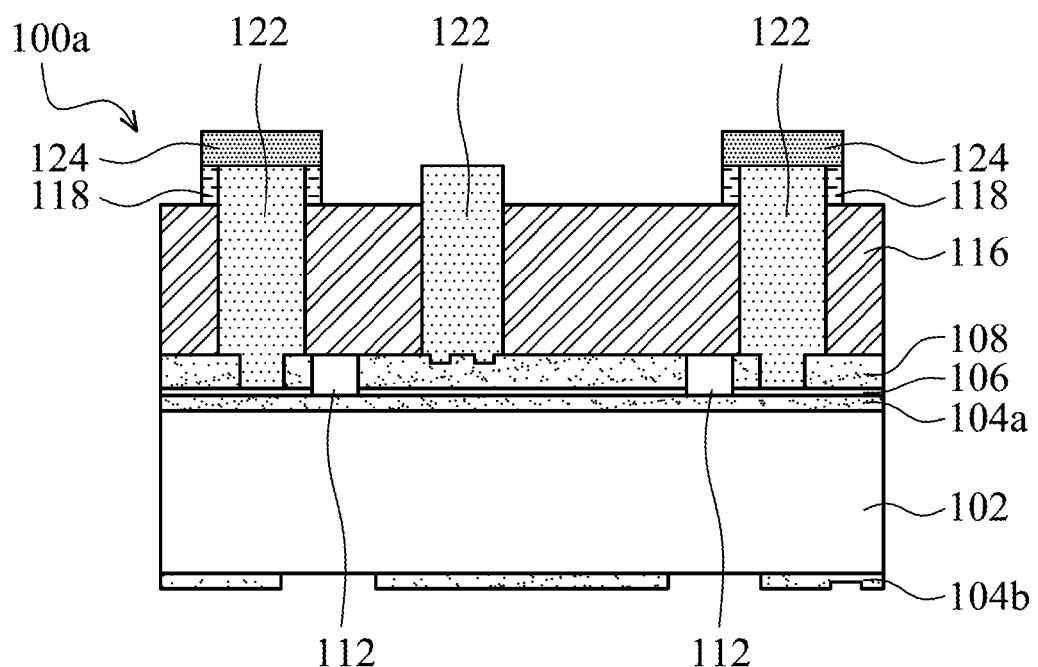
Figure 9:
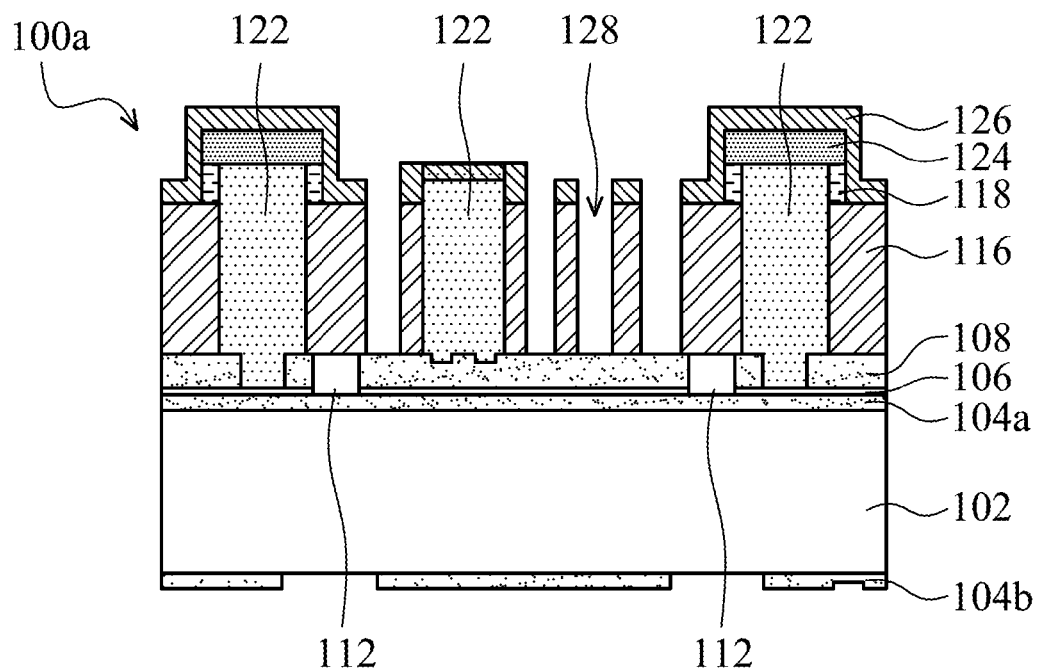

The oxide 118 is etched back using an etch process, as shown in FIG. 8. A portion of the oxide 118 remains on sidewalls of the plugs 122 comprising the anchors. An oxide 126 is formed over the substrate 116, conductive material 124, and the center plug 122, as shown in FIG. 9. The oxide 126 may comprise silicon dioxide having a thickness of about 1.0 μm, although alternatively, the oxide 126 may comprise other materials and dimensions. The oxide 126 is patterned for key MEMS functional structures, and the oxide 126 is then used as an etch hard mask during an etch process for the substrate 116, forming patterns 128 in the substrate 116.

Figure 10:
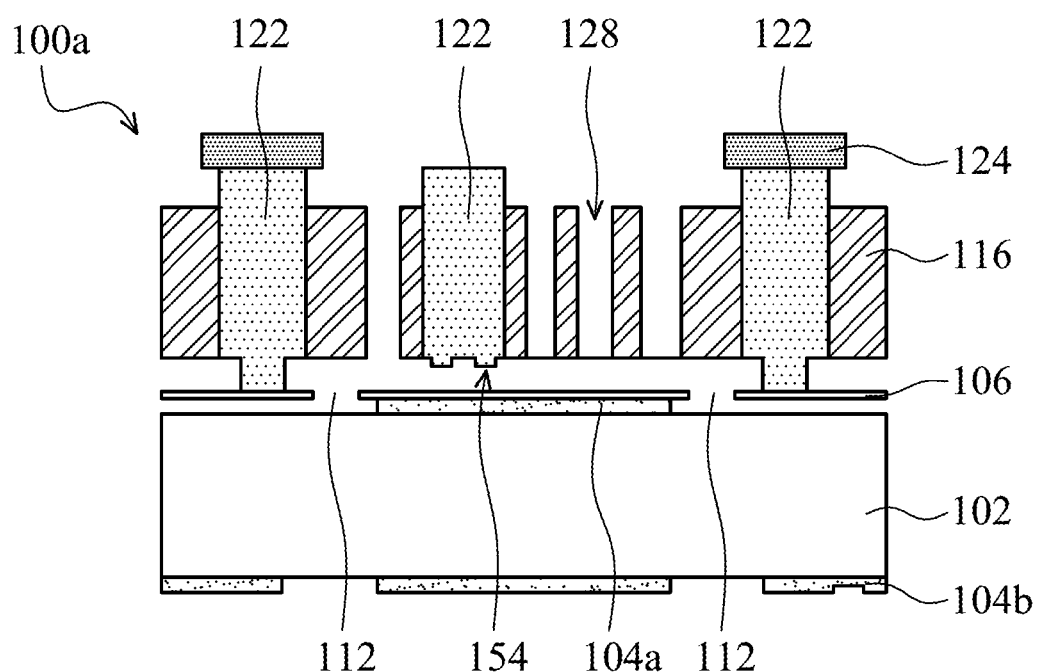

A vaporized hydrofluoric (HF) acid etch process or other type of etch process is used to remove the oxides 126 and 118, dielectric film 108 and portions of oxide 104a, as shown in FIG. 10, forming the MEMS functional structure 100a. The HF etch process is a releasing step that removes the sacrificial oxides 126 and 118, dielectric film 108 and portions of the oxide 104a, allowing moveable elements (not shown) of the MEMS functional structure 100a to have mechanical movement within an inner region cavity 154 of the MEMS functional structure 100a. The HF etch process also releases the shallow trenches 112.

Figure 11:
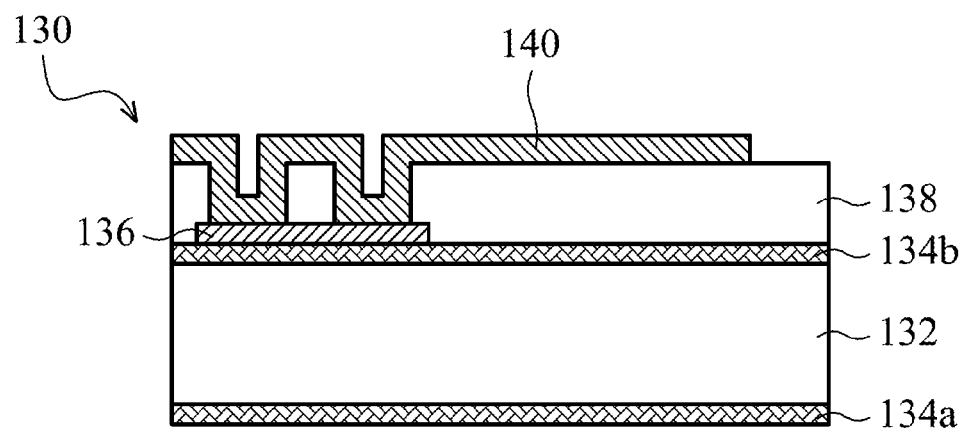

Referring next to FIG. 11, a third substrate 130 is provided. The third substrate 130 comprises a cap wafer which is bonded to the conductive material 124 of the MEMS functional structure 100a. The third substrate 130 comprises a routing substrate or a complementary metal oxide semiconductor (CMOS) wafer, as examples. The third substrate 130 includes a wafer 132 having an oxide 134a and 134b formed on the front side and back side, respectively. The wafer 132 comprises a semiconductor material, glass, or other material, and the oxide 134a and 134b comprises silicon dioxide having a thickness of about 2 μm, as examples. Alternatively, the oxide 134a and 134b may comprise other materials and dimensions.

A conductive material 136 is formed over the oxide 134b and patterned. The conductive material 136 may comprise polysilicon, a metal, or a metal alloy having a thickness of about 3 kÅ, as an example, although alternatively, the conductive material 136 may comprise other materials and dimensions. The conductive material 136 is patterned using lithography, and an insulating material 138 is formed over conductive material 136. Insulating material 138 comprises about 1 μm of silicon dioxide in some embodiments, although alternatively, the insulating material 138 may comprise other dimensions and materials. The insulating material 138 is patterned, and a conductive material 140 is formed over the patterned insulating material 138. The conductive material 140 may comprise about 0.8 μm of AlCu or an AlCu alloy to make ohmic contact directly between an interface of two conductive layers in some embodiments, although alternatively, the conductive material 140 may comprise other dimensions and materials. The conductive material 140 is then patterned using a lithography process, as shown in FIG. 11.

Figure 12:
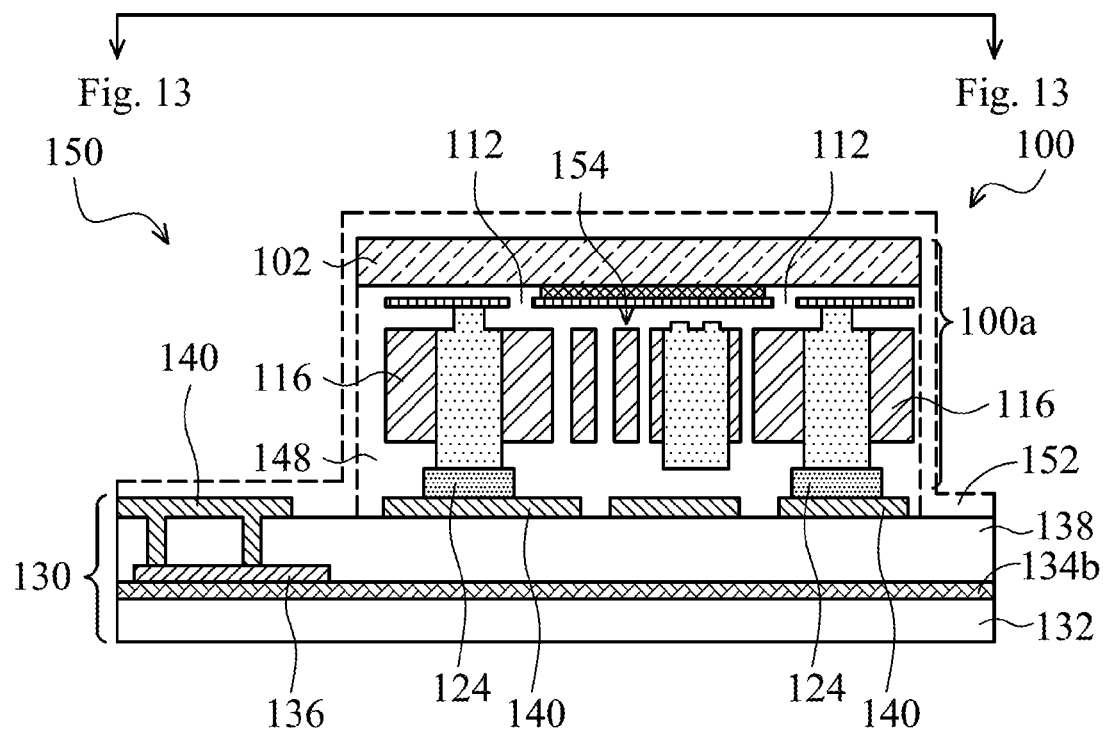
Figure 13:
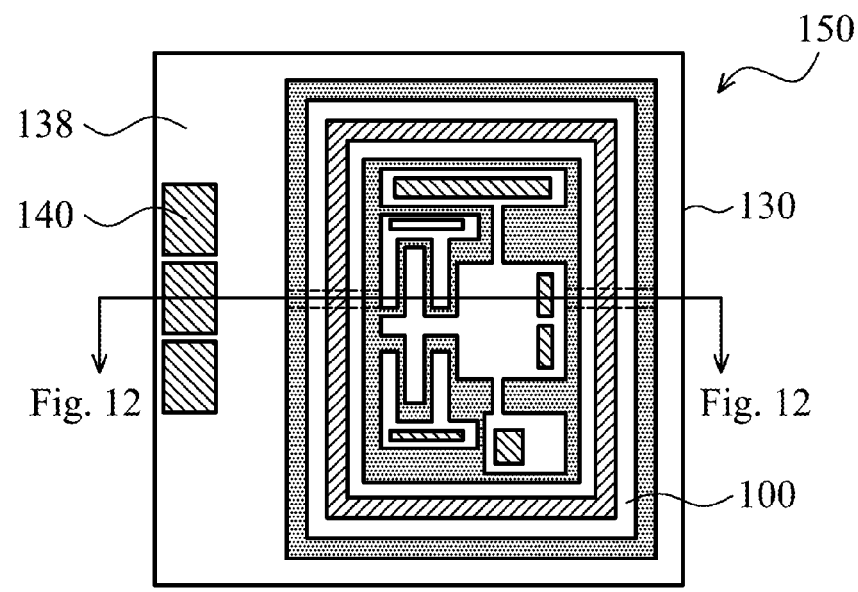
FIG. 13 is a top view of the packaged MEMS device shown in FIG. 12.

The MEMS functional structure 100a is then coupled to the third substrate 130, forming a packaged MEMS device 150 using a wafer level bonding technique (e.g., used in wafer level packaging), as shown in FIG. 12. The MEMS functional structure 100a will be well protected and sealed at a predetermined vacuum level ranging from about 1 mbar to about 1 atm inside the close-up ring 142. The second substrate 116 is coupled to the third substrate 130, and portions of the first substrate 102 and the second substrate 116 are diced to expose the patterned conductive material 140 comprising contact pads defined on the third substrate 130. FIG. 13 shows a top of the packaged MEMS device 150 shown in FIG. 12. Conductive material 124 of the MEMS functional structure 100a is coupled to the patterned conductive material 140 on the third substrate 130 using a metal-to-metal bond, eutectic bond, or other methods. Conductive material 124 comprises a eutectic material in some embodiments, for example. The MEMS functional structures 100a will be well protected inside the close-up ring 142. The conductive material 140 on the left in FIGS. 12 and 13 comprises contact pads for the packaged MEMS device 150. The region of the packaged MEMS device 150 above the contact pads comprises an opening for wire-bonds or a subsequent packaging level interface, for example.

Figure 14:
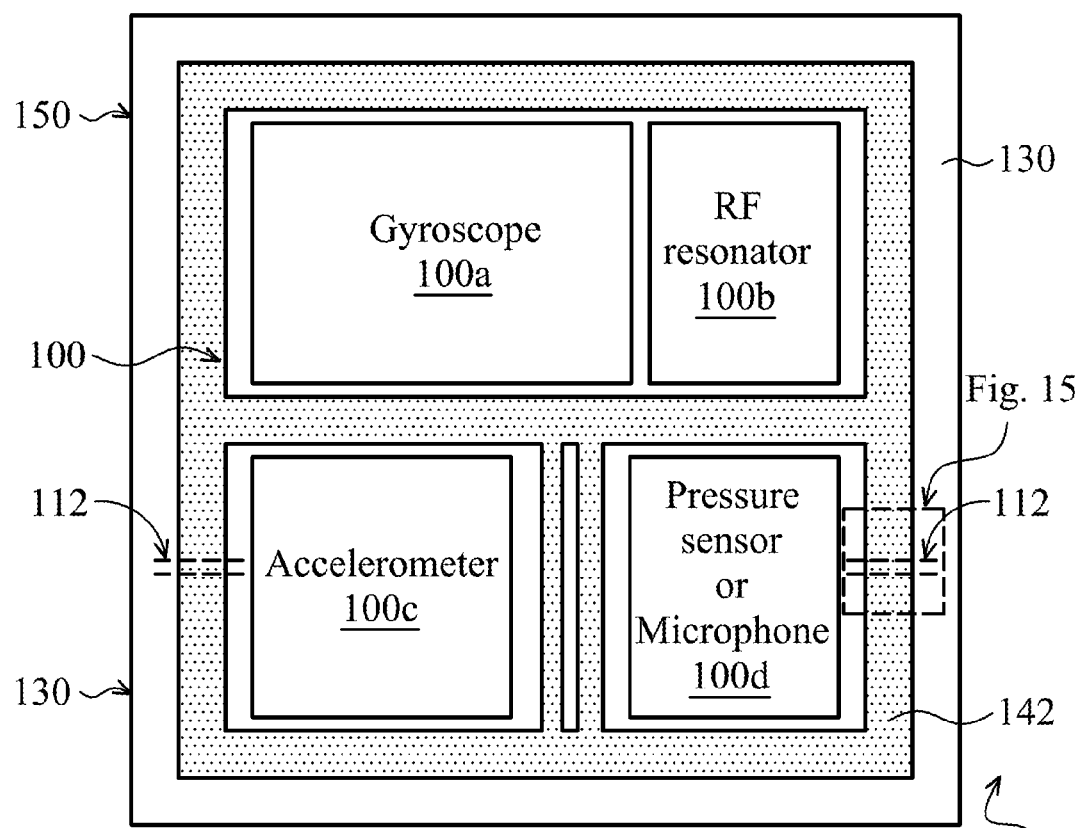
FIG. 14 is a top view of a packaged MEMS device in accordance with an embodiment.

Only one MEMS functional structure 100a of a MEMS device 100 is shown in FIGS. 1 through 12; however, a plurality of MEMS functional structures 100a are simultaneously formed on the first and second substrates 102 and 116 for the MEMS device 100 in accordance with embodiments, as shown in FIGS. 14 at 100a, 100b, 100c, and 100d, to be described further herein. A plurality of the MEMS devices 100 including the MEMS functional structures 100*a*, 100*b*, 100*c*, and 100*d* are formed on the first and second substrates 102 and 116. Later in the process flow, after attaching the MEMS device 100 to the third substrate 130 and applying one or more pressures, to be described further herein, the MEMS devices 100 are separated or singulated into packaged MEMS device 150 (see FIG. 12), e.g., by sawing the three bonded substrates 102, 116, and 130 along a scribe line.

After the third substrate 130 is coupled to the MEMS functional structure 100*a* (and also at least one other MEMS functional structure 100*b*, 100*c*, and 100*d*), pressure is created in the interior region of the MEMS functional structures 100*a*, in accordance with embodiments. The interior region comprises an inner region cavity 154 that contains a moveable element of each of the MEMS functional structures 100*a* in some embodiments, for example. The inner region cavity 154 containing the moveable element is disposed between the first substrate 102 and the second substrate 116. The amount of pressure applied is different for at least two of the MEMS functional structures 100*a*, 100*b*, 100*c*, and 100*d* in accordance with embodiments.

During the application of the pressure, a sealing material 148, shown in phantom in FIG. 12, is applied to the MEMS functional structure 100*a*. As an example, the bonded substrate 130 and MEMS functional structures 100*a* may be placed in a chamber, and a pressure can be applied in the chamber. The pressure may be applied by creating a vacuum inside the chamber to apply a vacuum to the MEMS functional structure 100*a*, as an example. The sealing material 148 is then applied along edges of the MEMS functional structures 100*a* while the pressure is maintained in the chamber. The sealing material 148 maintains the pressure inside the MEMS functional structure 100*a* after the MEMS device 100 is removed from the chamber. A hermetic vacuum seal is formed inside the MEMS functional structure 100*a* in some embodiments. The sealing material 148 comprises a sealing ring, a sealing ring with shallow trench patterns disposed beneath the sealing ring, a bonding ring, or a sealing gel in some embodiments, for example. The sealing material 148 may comprise a thin film oxide, polyimide, epoxy, or an organic gel having a thickness of about 10 μm, as examples, although alternatively, the sealing material 148 may comprise other materials and dimensions. The sealing material 148 does not extend into the inner region 154 containing the moveable element.

A different pressure may be created in interior region cavities 154 of the various MEMS functional structures 100*a*, 100*b*, 100*c*, and 100*d* of the MEMS device 100, depending on the pressure required for the particular MEMS functional structure 100*a*, 100*b*, 100*c*, and 100*d*. Some MEMS functional structures 100*a*, 100*b*, 100*c*, and 100*d* may not require a particular pressure in some embodiments, and a sealing material 148 may not be required.

An encapsulation material 152 may also be applied, or may alternatively be applied (e.g., to the sealing material 148), while the bonded substrate 130 and MEMS functional structures 100*a*, 100*b*, 100*c*, and 100*d* (e.g., over all of the MEMS functional structures of the MEMS device 100) are in the chamber. The encapsulation material 152 may alternatively be applied after the bonded substrate 130 and MEMS functional structures 100*a*, 100*b*, 100*c*, and 100*d* have been removed from the chamber, in other embodiments. The encapsulating material 152 is disposed over the sealing material 148, if included, and over the MEMS functional structures 100*a*, 100*b*, 100*c*, and 100*d*, as shown in phantom in FIG. 12. The encapsulating material 152 may comprise glass or a CMOS packaging gel having a thickness of about 1 mm, as examples, although alternatively, the encapsulating material 152 may comprise other materials and dimensions. The encapsulating material 152 protects the MEMS functional structures 100*a*, 100*b*, 100*c*, and 100*d* in harsh environments, such as moisture or shock, and also assists in providing pressure control for the interior region cavities 154 of the MEMS functional structures 100*a*, 100*b*, 100*c*, and 100*d*, for example.

In some embodiments, one or more of the MEMS functional structures 100*a*, 100*b*, 100*c*, and 100*d* may not include a sealing material 148 and/or an encapsulating material 152.

FIG. 14 is a top view of a packaged MEMS device 150 in accordance with an embodiment. The packaged MEMS device 150 includes a plurality of the MEMS functional structures 100*a*, 100*b*, 100*c*, and 100*d*. The MEMS functional structure 100*a* comprises a gyroscope, and the MEMS functional structure 100*b* comprises a resonator. The resonator may comprise a radio frequency (RF) resonator in some embodiments; however, other types of resonators may be included. The MEMS functional structure 100*c* comprises an accelerometer, and the MEMS functional structure 100*d* may comprise a pressure sensor or a microphone. Alternatively, the MEMS functional structures 100*a*, 100*b*, 100*c*, and 100*d* may comprise other types of micro-electro-mechanical systems. One or more of the MEMS functional structures 100*a*, 100*b*, 100*c*, and 100*d* may comprise a sensor in some embodiments. In other embodiments, one or more of the MEMS functional structures 100*a*, 100*b*, 100*c*, and 100*d* may comprise gyroscopes, resonators, accelerometers, microphones, pressure sensors, inertia sensors, actuators, or combinations thereof, as examples.

The shallow trenches 112 that make the pressure balanced inside the bonding ring 142 and outside the bonding ring 142, e.g., at a pressure of about 1 atm are shown in phantom in FIG. 14. The shallow trench 112 extends through at least one edge of the MEMS functional structures 100*a*, 100*b*, 100*c*, and 100*d* and comprises an opening for application of the pressure. The shallow trenches 112 are sealed after application of the pressure by the bonding ring 142 or other type of sealing material 148 used, for example. The shallow trenches 112 may not be included in each MEMS functional structure 100*a*, 100*b*, 100*c*, and 100*d*, e.g., if the MEMS functional structures 100*a*, 100*b*, 100*c*, and 100*d* have openings through which the pressure can be applied.

Figure 15:
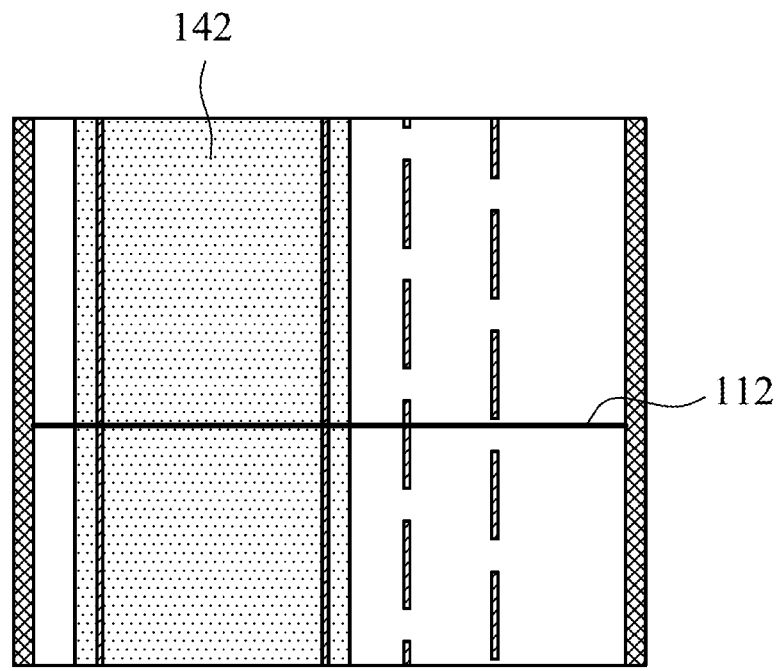
FIG. 15 is a more detailed view of a portion of the packaged MEMS device shown in FIG. 14.

FIG. 15 is a more detailed view of a portion of the packaged MEMS device 150 shown in FIG. 14. A more detailed view of the shallow trench 112 and the sealing material comprising the bonding ring 142 is shown. The shallow trench 112 comprises an air channel in some embodiments, which can be designed as a substantially straight line with a narrow gap of about 0.2 μm, for example. Alternatively, the shallow trench 112 can be a nozzle type of trench from a top view or a meandering type of trench, to let air or gas penetrate through the channel easily.

Figure 16:
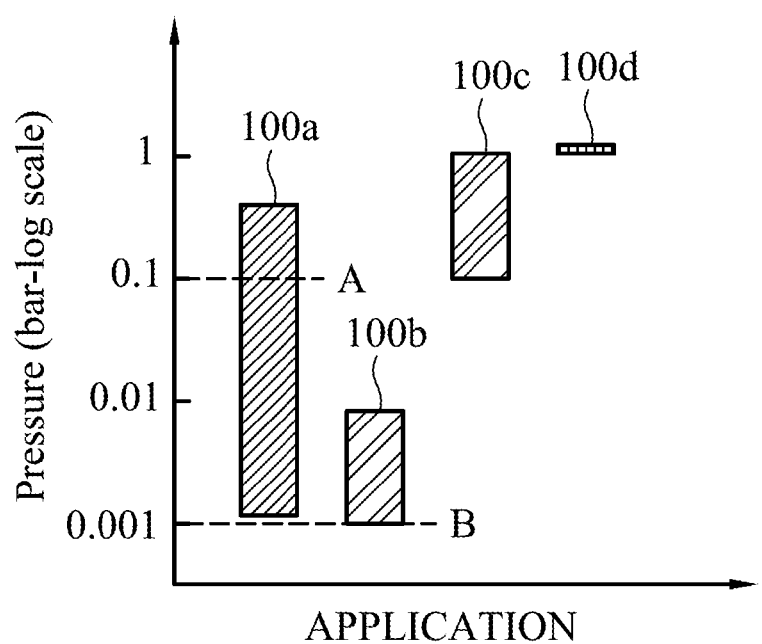
FIG. 16 is a graph illustrating various internal pressures of MEMS functional structures of the MEMS device shown in FIG. 14.

FIG. 16 is a graph illustrating various internal pressures of the plurality of MEMS functional structures 100*a*, 100*b*, 100*c*, and 100*d* of the packaged MEMS device 150 shown in FIG. 14, by application. A range of pressures for the MEMS functional structure 100*a* comprising a gyroscope may range from about 0.001 to 0.7 bar. A range of pressures for the MEMS functional structure 100*b* comprising a resonator may range from about 0.001 to 0.01 bar. A range of pressures for the MEMS functional structure 100*c* comprising an accelerometer may comprise about 0.1 to 1 bar. A pressure for the MEMS functional structure 100*d* comprising a pressure sensor or microphone may comprise about 1 bar. Alternatively, internal pressures in the inner region cavity 154 of the plurality of MEMS functional structures 100a, 100b, 100c, and 100d of the packaged MEMS device 150 may comprise other values, in accordance with embodiments of the present disclosure. Pressures for the various MEMS functional structures 100a, 100b, 100c, and 100d may advantageously vary from about a millibar (mbar) level to a bar level, so that about 3 orders of magnitude of pressure difference is achieved within a single packaged MEMS device 150, for example.

Figure 17:
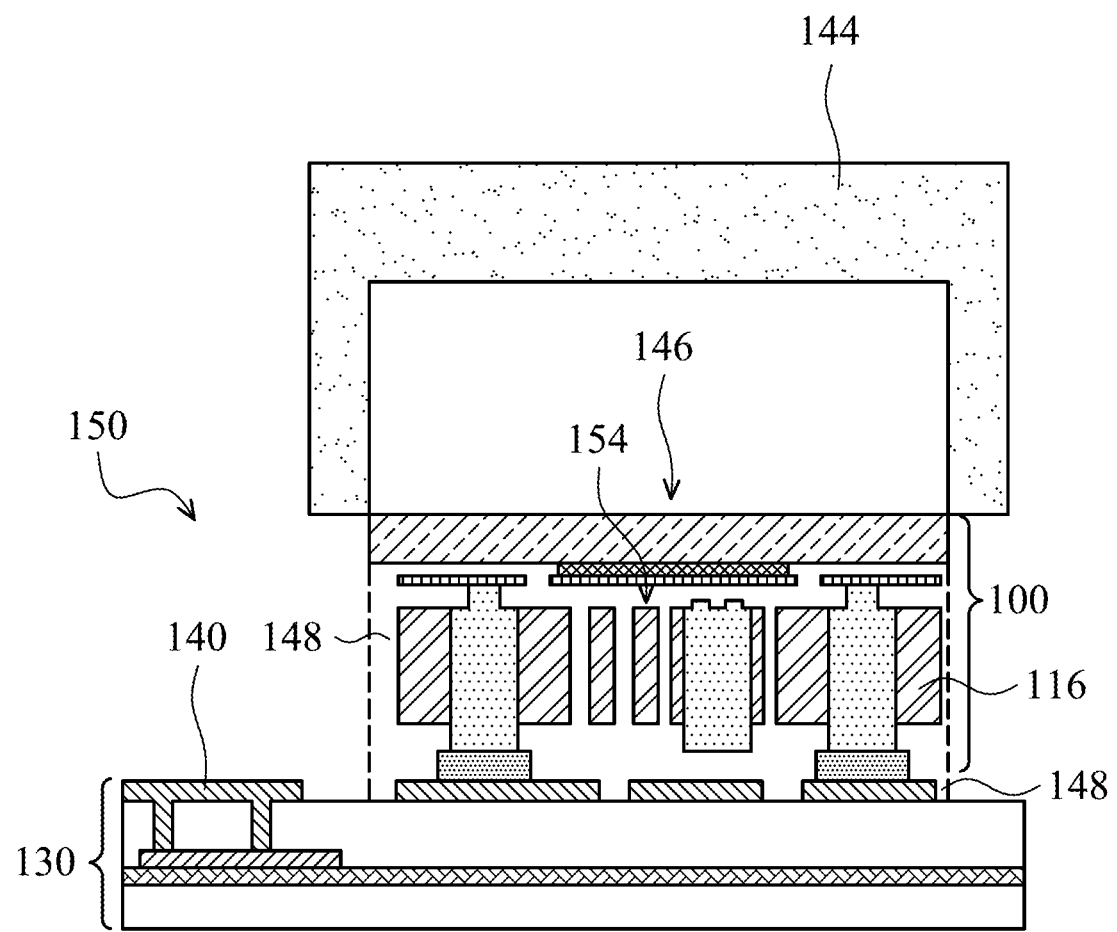
FIG. 17 is a cross-sectional view illustrating a method of controlling and establishing the various internal pressures of the MEMS device using a pump in accordance with an embodiment.

FIG. 17 is a cross-sectional view illustrating a method of controlling and establishing the various internal pressures using a pump 144 in accordance with an embodiment. The pump 144 is placed proximate the packaged MEMS device 150, and pressure 146 is applied by the pump 144 on the packaged MEMS device 150. While the pressure 146 is applied by the pump 144, the sealing material 148 is applied to a particular packaged MEMS device 150 that requires that pressure. The process is continued for different pressure levels required by the various MEMS functional structures 100a, 100b, 100c, and 100d of the packaged MEMS device 150. The pump 144 may be placed in the chamber that the packaged MEMS device 150 is being processed in, and the pressure 146 may be varied and applied as needed for each of the MEMS functional structures 100a, 100b, 100c, and 100d, after which the sealing material 148 is applied, for example. Each of the MEMS functional structures 100a, 100b, 100c, and 100d is sequentially processed to apply the appropriate amount of pressure 146 for the particular application of the MEMS functional structures 100a, 100b, 100c, and 100d.

Some of the MEMS functional structures 100a, 100b, 100c, and 100d may not have pressure 146 applied, in some embodiments. These MEMS functional structures 100a, 100b, 100c, and 100d are exposed to the pressure 146 while other of the MEMS functional structures 100a, 100b, 100c, and 100d have pressure 146 applied and are sealed with the sealing material 148. However, because a sealing material 148 is not applied to the MEMS functional structures 100a, 100b, 100c, and 100d not needing an internal pressure, when the pressure 146 is removed, the MEMS functional structures 100a, 100b, 100c, and 100d do not retain an internal pressure in the inner region cavity 154.

Only four MEMS functional structures 100a, 100b, 100c, and 100d are shown in FIG. 14. There may be five or more MEMS functional structures 100a, 100b, 100c, and 100d formed on a single MEMS device 100 or on a single packaged MEMS device 150 in accordance with embodiments. Some of the MEMS functional structures 100a, 100b, 100c, and 100d may have the same pressure applied. Alternatively, all of the MEMS functional structures 100a, 100b, 100c, and 100d may have different pressures applied, for example. In accordance with an embodiment, at least two of the MEMS functional structures 100a, 100b, 100c, and 100d have different internal pressures; e.g., different pressures in the interior region cavity 154.

Figure 18:
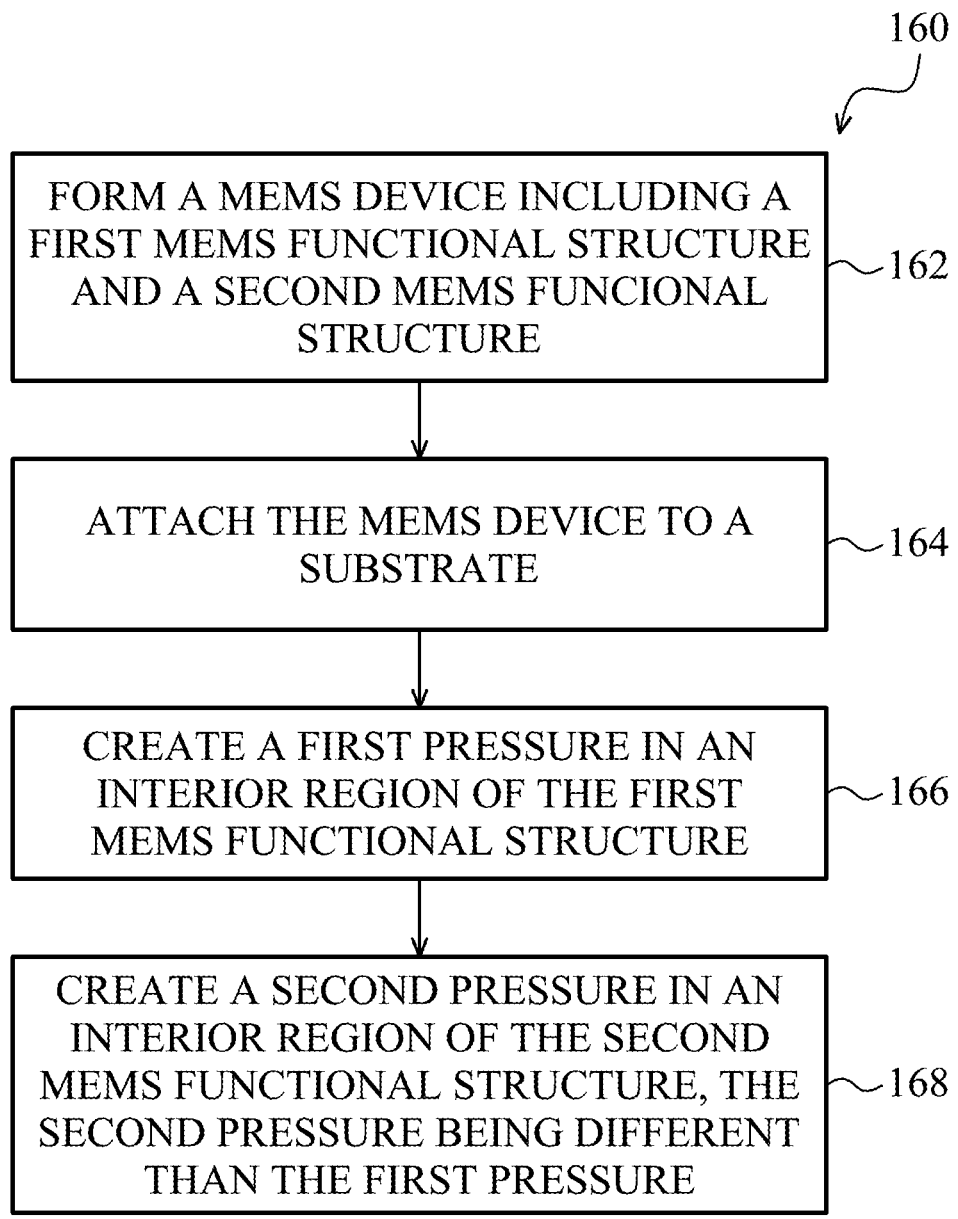
FIG. 18 is a flow chart showing a method of manufacturing a MEMS device having different internal pressures in accordance with an embodiment.

FIG. 18 is a flow chart 160 showing a method of packaging a MEMS device 100 including a plurality of MEMS functional structures 100a and 100b (see FIG. 14) having different internal pressures A and B (see FIG. 16) in accordance with an embodiment. In step 162, a MEMS device 100 is formed that includes a first MEMS functional structure 100a and a second MEMS functional structure 100b. In step 164, the MEMS device 100 is attached to a substrate 130. In step 166, a first pressure A is created in an interior region (e.g., in an interior region cavity 154) of the first MEMS functional structure 100a. In step 168, a second pressure B is created in an interior region of the second MEMS functional structure 100b. The second pressure B is different than the first pressure A.

Embodiments of the present disclosure include methods of forming MEMS devices 100, and also include MEMS devices 100 that include the novel MEMS functional structures 100a, 100b, 100c, and 100d having different internal pressures. Embodiments of the present disclosure also include packaged MEMS devices 150 that have been packaged using the novel methods and MEMS devices 100 described herein.

The packaged MEMS devices 150 comprise wafer level packages (WLP) that can be mounted to a circuit board, substrate, or other mounting platform, and then electrically coupled to other devices, such as integrated circuits, other MEMS devices, resistors, transistors, capacitors, and other elements or modules, depending on the end application. Wire bonds and/or solder can be connected to the patterned conductive material 140 on the top surface of the substrate 130 (e.g., on the left in FIGS. 12 and 13), for example. Alternatively, the substrate 130 can include contacts on a bottom surface thereof, and the contacts can be mounted on a mounting platform in an end application using solder balls (not shown).

The manufacturing and packaging process flow illustrated and described for FIGS. 1 through 12 are for illustrative purposes: other MEMS device structures and methods may be used. Similarly, the packaged MEMS device 150 shown in FIG. 14 showing the various functions of the MEMS functional structures 100a, 100b, 100c, and 100d is for illustrative purposes: two or more MEMS functional structures 100a, 100b, 100c, and 100d described herein may be formed in a single packaged MEMS device 150 in accordance with embodiments. The MEMS functional structures 100a, 100b, 100c, and 100d may have the same function and MEMS structure, or they may have different functions and structures, as another example.

Advantages of embodiments of the disclosure include providing novel packaged MEMS devices 150, MEMS devices 100, and methods of fabrication thereof, wherein the various MEMS functional structures 100a, 100b, 100c, and 100d have different internal pressures, depending on the MEMS functional structure 100a, 100b, 100c, and 100d requirements. Multiple sensors comprising the MEMS functional structures 100a, 100b, 100c, and 100d are integrated with different internal pressures in a single packaged MEMS device 150. Combining multiple MEMS functional structures 100a, 100b, 100c, and 100d on a single chip or packaged MEMS device 150 allows the overall chip size to be reduced and results in a reduced number of process flow steps. The methods described herein comprise die-level integration processes that reduce packaged die costs and surface area requirements. The MEMS devices 100 comprise multiple chambers that contain the MEMS functional structures 100a, 100b, 100c, and 100d, which each chamber having a controllable pressure level. Different pressure levels are advantageously formed in a single packaged MEMS device 150. The novel MEMS device 100 structures and designs are easily implementable in manufacturing process and packaging flows.

All of the MEMS devices 100 required for a particular end application can be combined in a single packaged MEMS device 150 in some embodiments, for example, resulting in an area and cost savings. The overall footprint of the final board the packaged MEMS device 150 is mounted on can advantageously be reduced. The space savings provided by embodiments of the present disclosure is particularly advantageous in end applications such as consumer electronics, which have a trend in technology development of shrinkage targets, for example.

In accordance with one embodiment of the present disclosure, a MEMS device includes a first MEMS functional structure and a second MEMS functional structure. An interior region of the second MEMS functional structure has a pressure that is different than a pressure of an interior region of the first MEMS functional structure.

In accordance with another embodiment, a packaged device includes a substrate and a MEMS device coupled to the substrate. The MEMS device comprises a first MEMS functional structure and a second MEMS functional structure. An interior region of the first MEMS functional structure has a first pressure, and an interior region of the second MEMS functional structure has a second pressure. The second pressure is different than the first pressure.

In accordance with yet another embodiment, a method of manufacturing a MEMS device includes forming the MEMS device, the MEMS device including a first MEMS functional structure and a second MEMS functional structure. The MEMS device is attached to a substrate. A first pressure is created in an interior region of the first MEMS functional structure. A second pressure is created in an interior region of the second MEMS functional structure. The second pressure is different than the first pressure in the MEMS device after wafer level packaging of the MEMS device.

Although embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A microelectromechanical system (MEMS) device, comprising:
   a first MEMS functional structure having an interior region, the interior region sealed by a first sealing ring;
   a shallow trench underlying the first sealing ring; and
   a second MEMS functional structure, wherein an interior region of the second MEMS functional structure is sealed by a second sealing ring and has a pressure that is different than a pressure of the interior region of the first MEMS functional structure.

2. The MEMS device according to claim 1, wherein the first MEMS functional structure and the second MEMS functional structure comprise a type selected from the group consisting essentially of a gyroscope, resonator, accelerometer, microphone, pressure sensor, inertia sensor, actuator, and combinations thereof.

3. The MEMS device according to claim 1, further comprising a third MEMS functional structure, wherein an interior region of the third MEMS functional structure has a pressure that is different than the pressure of the interior region of the first MEMS functional structure or the pressure of the interior region of the second MEMS functional structure.

4. The MEMS device according to claim 1, further comprising a third MEMS functional structure, wherein an interior region of the third MEMS functional structure has a pressure that is substantially the same as the pressure of the interior region of the first MEMS functional structure or the pressure of the interior region of the second MEMS functional structure.

5. The MEMS device according to claim 1, further comprising a plurality of third MEMS functional structures.

6. The MEMS device according to claim 1, wherein the first MEMS functional structure or the second MEMS functional structure comprises a sensor.

7. The MEMS device according to claim 1, further comprising an encapsulating material disposed over the first MEMS functional structure or the second MEMS functional structure.

8. A packaged device, including:
   a substrate;
   a microelectromechanical system (MEMS) device coupled to the substrate, wherein the MEMS device comprises a first MEMS functional structure and a second MEMS functional structure, wherein an interior region of the first MEMS functional structure is sealed by a first sealing ring and has a first pressure, wherein an interior region of the second MEMS functional structure is sealed by a second sealing ring and has a second pressure, and wherein the second pressure is different than the first pressure; and
   at least one shallow trench underlying at least one of the first sealing ring and the second sealing ring.

9. The packaged device according to claim 8, further comprising an encapsulating material disposed over the sealing material, the first MEMS functional structure, or the second MEMS functional structure.

10. The packaged device according to claim 8, wherein the substrate comprises a first substrate, and wherein the MEMS device includes a second substrate coupled to a third substrate.

11. The packaged device according to claim 10, wherein a moveable element of the first MEMS functional structure or the second MEMS functional structure is disposed between the second substrate and third substrate.

12. The packaged device according to claim 8, wherein the substrate comprises a cap wafer comprising a routing substrate or a complementary metal oxide semiconductor (CMOS) wafer.

13. A method of manufacturing a microelectromechanical (MEMS) device, the method comprising:
   forming the MEMS device, the MEMS device including a first MEMS functional structure and a second MEMS functional structure;
   forming a first sealing ring sealing an interior of the first MEMS functional structure and a second sealing ring sealing an interior of the second MEMS functional structure;
   forming under at least one of the first sealing ring and the second sealing ring, a shallow trench extending from outside at least one of the first MEMS functional structure and the second MEMS functional structure to an interior region of the at least one of the first MEMS functional structure and the second MEMS functional structure;
   attaching the MEMS device to a substrate;

creating a first pressure in an interior region of the first MEMS functional structure; and creating a second pressure in an interior region of the second MEMS functional structure, wherein the second pressure is different than the first pressure in the MEMS device after wafer level packaging of the MEMS device.

14. The method according to claim 13, wherein creating the first pressure comprises applying a vacuum to the first MEMS functional structure, or wherein creating the second pressure comprises applying a vacuum to the second MEMS functional structure.

15. The method according to claim 13, further comprising applying a sealing material on the first MEMS functional structure while creating the first pressure, or applying a sealing material on the second MEMS functional structure while creating the second pressure.

16. The method according to claim 13, wherein the first MEMS functional structure or the second MEMS functional structure comprises a shallow trench disposed beneath a sealing ring, and wherein the method comprises creating the first pressure or creating the second pressure using the shallow trench beneath the sealing ring.

17. The method according to claim 13, wherein creating the first pressure in the interior region of the first MEMS functional structure or creating the second pressure in the interior region of the second MEMS functional structure comprises using a pump.

18. The method according to claim 13, further comprising attaching a bonding ring to the substrate around and between the first MEMS functional structure and the second MEMS functional structure.

* * * * *